United States Patent [19]
D'Souza

[11] Patent Number: 5,929,724
[45] Date of Patent: Jul. 27, 1999

[54] LOW LOSS SAW FILTERS WITH NON-SEQUENTIAL COUPLING AND METHOD OF OPERATION THEREOF

[75] Inventor: Ian A. D'Souza, Waterloo, Canada

[73] Assignee: Com Dev Ltd., Cambridge, Canada

[21] Appl. No.: 09/123,363

[22] Filed: Jul. 28, 1998

[51] Int. Cl.⁶ .................................................. H03H 9/64
[52] U.S. Cl. ........................................... 333/193; 333/195
[58] Field of Search ..................................... 333/193–196

[56] References Cited

U.S. PATENT DOCUMENTS

| 3,970,970 | 7/1976 | Worley ..................................... 333/195 |
| 4,065,735 | 12/1977 | Palfreeman et al. ..................... 333/195 |
| 4,609,891 | 9/1986 | Solie et al. .......................... 333/194 X |
| 5,363,073 | 11/1994 | Higgins ................................... 333/195 |

FOREIGN PATENT DOCUMENTS

| 3-201613 | 9/1991 | Japan ..................................... 333/195 |
| 3-222512 | 10/1991 | Japan ..................................... 333/195 |
| 3-283710 | 12/1991 | Japan ..................................... 333/195 |

*Primary Examiner*—Robert Pascal
*Assistant Examiner*—Barbara Summons
*Attorney, Agent, or Firm*—Daryl W. Schnurr

[57] ABSTRACT

A low loss surface acoustic wave (SAW) filter and method of operation thereof uses non-sequential coupling and, more particularly, cross-coupling to achieve good rejection characteristics with low loss. Strips of metallization are used with a circuit formed of a thin film of metallization. The strips are oriented parallel to an edge of each resonator being cross-coupled. In a six resonator filter, the second and fifth resonators are cross-coupled.

12 Claims, 3 Drawing Sheets

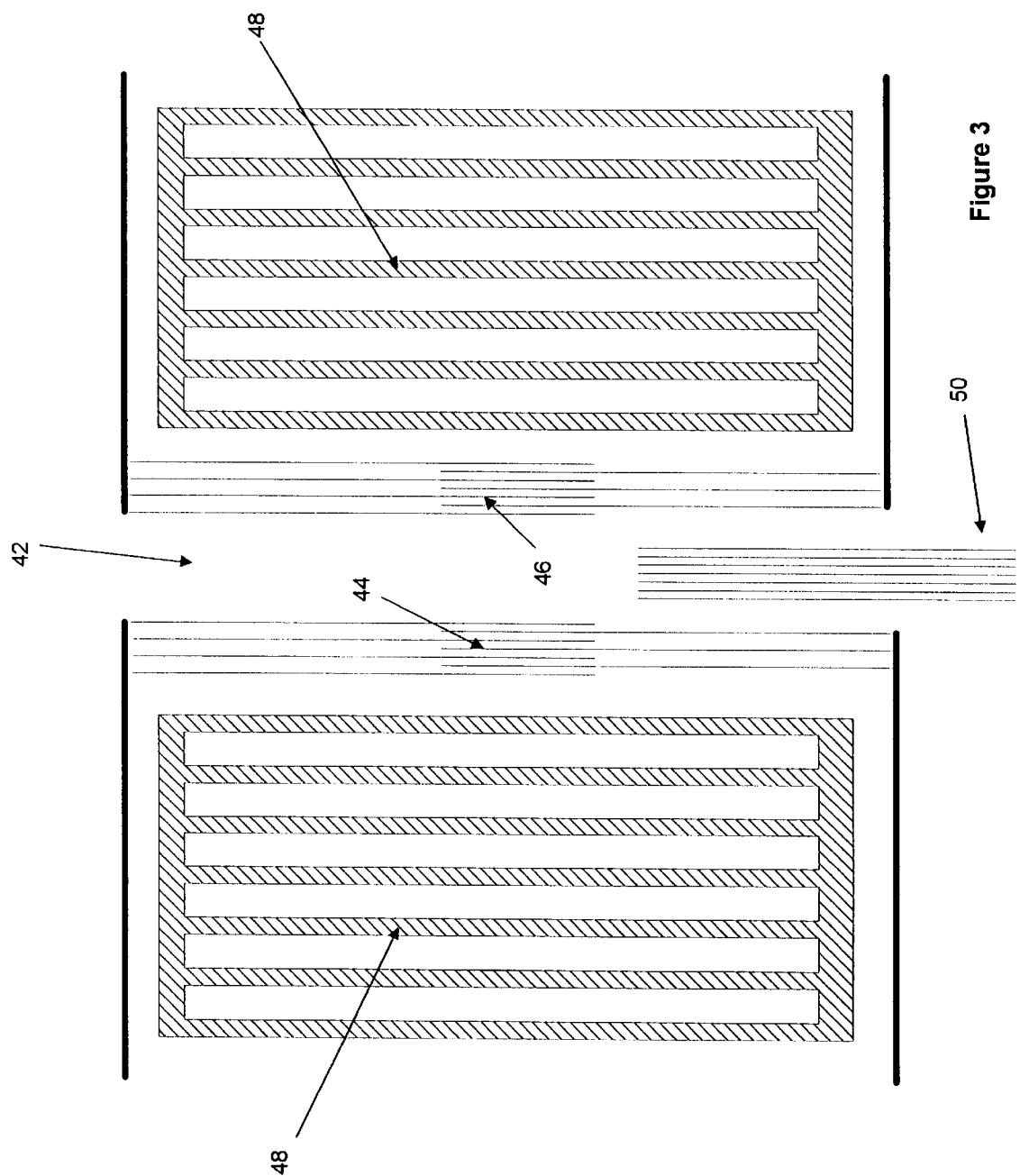

LOW LOSS SAW FILTERS WITH NON-SEQUENTIAL COUPLING AND METHOD OF OPERATION THEREOF

BACKGROUND OF THE INVENTION

1. Field of the Invention

This invention relates to low loss surface acoustic wave (SAW) filters and to a method of operation thereof. More particularly, this invention relates to the realization of low loss resonator type SAW filters with good rejection performance using non-sequential coupling, often referred to as cross-coupling.

2. Description of the Prior Art

SAW filters are known and can achieve good-band loss performance but the roll-off (rejection) characteristics are generally unsatisfactory. Known low-loss SAW devices that utilize resonator technology suffer from unacceptable rejection characteristics. Good rejection characteristics can be achieved using transversal SAW filter technology, but the loss of these filters increases. Although some progress has been made with unidirectional transversal filters that exhibit both "low" loss and good rejection, the loss of these devices is still much higher than that achievable using SAW resonator filters. Also, unidirectional transversal filters are relatively expensive compared to SAW resonator filters in relation to design costs, manufacturing costs, external matching hardware required and size.

Resonator filters are generally used in Personal Communication Systems (PCS) and low power applications. Transversal filters (with amplification to compensate for the high loss) are used in the more demanding communications satellite market.

SUMMARY OF THE INVENTION

It is an object of the present invention to present a low loss SAW filter with good rejection characteristics.

A low loss acoustic wave filter has a circuit formed of a thin film of metallization on a substrate. The circuit has at least four resonators sequentially arranged on the substrate. The circuit has an input and an output with cross coupling means to cross couple two of said resonators. The resonators resonate in at least one mode.

A method of operating a low loss acoustic wave filter comprising a circuit formed of a thin film of metallization on a substrate, said substrate being located in a housing, said circuit having at least four resonators sequentially arranged on said substrate, said circuit having an input and an output with cross coupling means to cross couple two of said resonators, said method comprising operating said filter to cross couple two non-sequential resonators.

BRIEF DESCRIPTION OF THE DRAWINGS

In the drawings:

FIG. 3 is an enlarged top view of a resonator and two reflector arrays.

DESCRIPTION OF A PREFERRED EMBODIMENT

It has been discovered that low loss SAW filters with good rejection characteristics can be obtained using cross coupling between non-sequential resonators. An elliptic or quasi-elliptic filter function is used.

One way of achieving the non-sequential cross coupling is to use strips of metallization that are parallel to an edge of each of the resonators being cross coupled.

Figure 1:
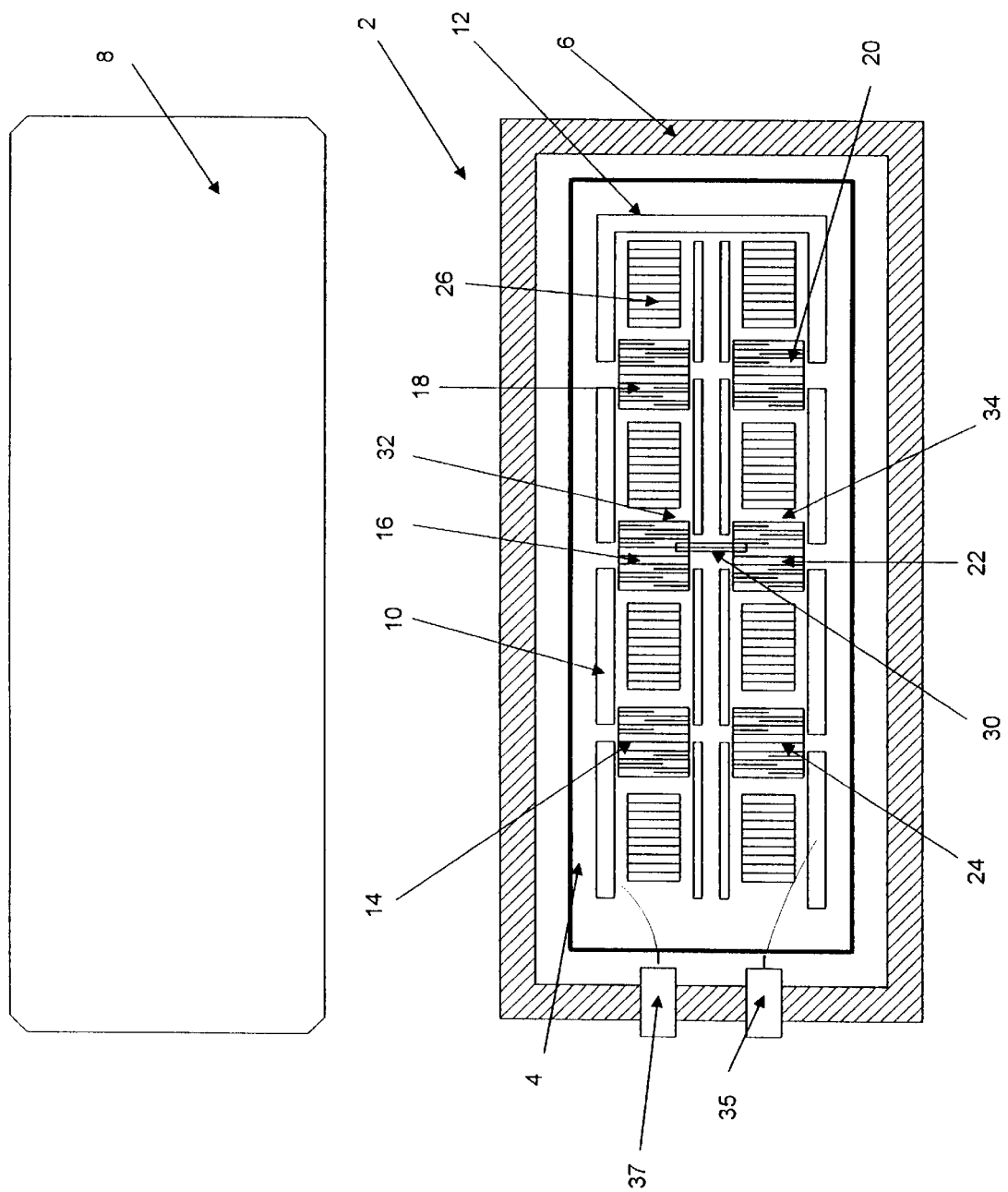
FIG. 1 is a top view of a six resonator filter.

In FIG. 1, there is shown a SAW filter 2 having a substrate 4 contained in a housing 6 with a cover 8. The cover 8 has been removed for purposes of illustration. On the substrate 4 there is located a circuit 10, preferably formed of a thin film 12 of metallization. The filter 2 can be six-pole filter up to a twelve-pole filter depending on whether the resonators are operated in a single mode or dual-mode respectively. The circuit 10 has a first resonator 14, a second resonator 16, a third resonator 18, a fourth resonator 20, a fifth resonator 22 and a sixth resonator 24 arranged sequentially. Acoustic energy is reflected back and forth inside the resonators with reflections coming from reflector arrays 26. There are cross coupling means 30 being a strip extending between the second resonator 16 and the fifth resonator 22 to cross couple these two resonators. The strip 30 is preferably a thin film of metallization and is parallel to a edge 32 of the second resonator 16 and an edge 34 of the fifth resonator 22 but does not contact those resonators. There are a total of eight reflector arrays 26, one on either side of each resonator. The interior resonators 16, 22 share reflector arrays with the exterior resonators 14, 18, 20, 24. The filter 2 has an input 35 and output 37.

The second and fifth resonators are non-sequential resonators and the coupling between these resonators is therefore a non-sequential cross coupling. The non-sequential coupling results in a superior rejection band for the filter 2 compared to conventional SAW filters.

Figure 2:
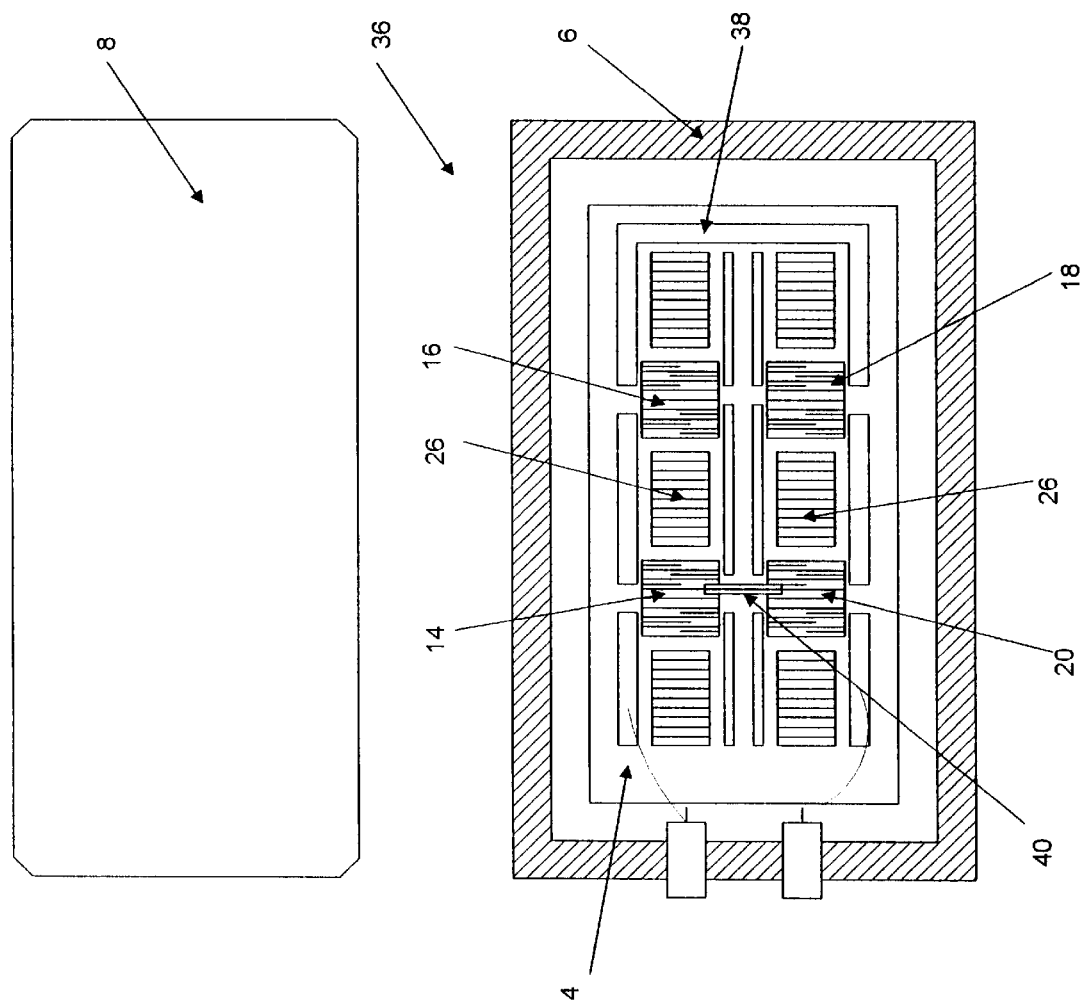
FIG. 2 is a top view of a four resonator filter.

In FIG. 2, there is shown a SAW filter 36 having a substrate 4 contained in a housing 6 with a cover 8. Those components that are similar to the components of the filter 2 shown in FIG. 1 will be described using the same reference numerals as those used for FIG. 1. The cover 8 has been removed for purposes of illustration. On the substrate 4, there is located a circuit 38, preferably formed of a thin film of metallization. The filter 36 can be a four-pole filter or up to an eight-pole filter depending on whether the resonators are operated in a single mode or a dual-mode respectively. The circuit 38 has a first resonator 14, a second resonator 16, a third resonator 18 and a fourth resonator 20. Acoustic energy is reflected back and forth inside the resonators with reflections coming from reflector arrays 26. Cross coupling means 40 is a strip extending between the first resonator 14 and the fourth resonator 20. The strip 40 is geometrically similar to the strip 30 of FIG. 1. There is one reflector array 26 on either side of each resonator, there being a total of six reflector arrays.

In FIG. 3, a resonator 42 has two interdigital transducers 44, 46 that are spaced apart from one another. On either side of the resonator 42, there is located a reflector array 48. A cross coupling electrode 50 is partially shown extending between the two interdigital transducers and extending to another resonator (not shown).

Theoretically, the signal travels along two separate paths at the cross-coupled resonators, one direct path and one by-pass path. This results in a transmission zero occurring due to phase cancellation at a particular frequency. This cancellation is preferably designed to occur near band edges in order to improve rejection performance.

The filter of the present invention has an advantage in that low loss is achieved in accordance with rejection characteristics that approach the rejection characteristics of a comparable transversal filter.

In the C-band frequency range, it is estimated that savings in mass of the order of 100 over current conventional C-band dielectric resonator filters can be achieved by the filter of the present invention as well as a reduction in size of the order 10. In addition, the filter of the present invention could produce still smaller and lighter filters than are presently available with High Temperature Superconductive (HTS) technology.

The filter and method relating to low loss SAW filters of the present invention is not limited to the use of parallel strips for cross coupling between non-sequential resonators. The present invention can be used with single mode or dual-made SAW resonator filters that have a minimum of four resonators. The layout of the resonators shown in the drawings is an example only and various other circuit diagrams can be utilized within the scope of the attached claims.

I claim:

1. A low loss surface acoustic wave filter comprising a circuit formed of a thin film of metallization on a substrate, said circuit having at least four resonators sequentially arranged on said substrate, said circuit having an input and an output with cross coupling means to cross couple two of said resonators, said resonators resonating in at least one mode.

2. A surface acoustic wave filter as claimed in claim 1 wherein the number of resonators in the circuit is equal to n and the maximum number of resonators being subjected to cross coupling is equal to n−2.

3. A surface acoustic wave filter as claimed in claim 2 wherein the means to cross couple is an electrode strip located on the substrate, said strip extending between each pair of resonators that is cross coupled.

4. A surface acoustic wave filter as claimed in claim 1 wherein there is a first resonator, second resonator, third resonator, fourth resonator, fifth resonator and sixth resonator and a reflector array on either side of each resonator, said resonators being arranged in sequence, there being cross coupling means to cross couple at least two non-sequential resonators.

5. A surface acoustic wave filter as claimed in claim 4 wherein the second and fifth resonators are cross coupled.

6. A surface acoustic wave filter as claimed in claim 4 wherein the means to cross couple is a coupling strip extending between said second resonator and said fifth resonator on said substrate, said coupling strip being out of contact with said resonators.

7. A surface acoustic wave filter as claimed in claim 6 wherein said strip is parallel to but spaced apart from an edge of said second resonator and an edge of said fifth resonator.

8. A surface acoustic wave filter as claimed in any one of claims 1, 3 or 4 wherein said resonators resonate in at least two modes.

9. A surface acoustic wave filter as claimed in any one of claims 1, 2 or 3 wherein the means to cross couple is a coupling strip extending between two resonators on said substrate, said two resonators being resonators that are to be cross coupled, said coupling strip being out of contact with said resonators.

10. A surface acoustic wave filter as claimed in claim 1 wherein there is a first resonator, second resonator, third resonator and fourth resonator and a reflector array on either side of each resonator, said resonators being arranged in sequence, there being cross coupling means to cross couple two non-sequential resonators.

11. A surface acoustic wave filter as claimed in any one of claims 4 or 10 wherein the number of resonators in the circuit is equal to n and the maximum number of resonators being subjected to cross coupling is equal to n−2 and the number of reflector arrays is equal to n+2.

12. A method of operating a low loss acoustic wave filter comprising a circuit formed of a thin film of metallization on a substrate, said substrate being located in a housing, said circuit having at least four resonators sequentially arranged on said substrate, said circuit having an input and an output with cross coupling means to cross couple two of said resonators, said method comprising operating said filter to cross couple two non-sequential resonators.

* * * * *